United States Patent
Bowers

(10) Patent No.: US 8,130,037 B2
(45) Date of Patent: Mar. 6, 2012

(54) APPARATUS AND METHOD FOR REDUCING CURRENT NOISE

(75) Inventor: Derek F. Bowers, Los Altos Hills, CA (US)

(73) Assignee: Analog Devices, Inc., Norwood, MA (US)

(*) Notice: Subject to any disclaimer, the term of this patent is extended or adjusted under 35 U.S.C. 154(b) by 164 days.

(21) Appl. No.: 12/730,046

(22) Filed: Mar. 23, 2010

(65) Prior Publication Data

US 2011/0234322 A1    Sep. 29, 2011

(51) Int. Cl.
*H03F 3/45* (2006.01)

(52) U.S. Cl. .................. 330/261; 330/296; 330/136

(58) Field of Classification Search .................. 330/261, 330/296, 136
See application file for complete search history.

(56) References Cited

U.S. PATENT DOCUMENTS

| | | | |
|---|---|---|---|
| 3,938,054 A * | 2/1976 | Leidich | 330/256 |
| 3,999,139 A * | 12/1976 | Fennell | 330/288 |
| 4,503,381 A | 3/1985 | Bowers | |
| 4,525,683 A * | 6/1985 | Jason | 330/288 |
| 4,843,342 A | 6/1989 | Hester et al. | |
| 5,128,564 A | 7/1992 | Harvey et al. | |
| 5,471,174 A | 11/1995 | Petty et al. | |
| 5,691,658 A * | 11/1997 | Klein | 327/104 |
| 6,271,695 B1 * | 8/2001 | Gramegna et al. | 327/110 |
| 6,636,111 B1 | 10/2003 | Gross et al. | |
| 6,965,267 B2 | 11/2005 | Delorme et al. | |
| 7,068,106 B2 | 6/2006 | Harvey | |
| 7,145,391 B2 | 12/2006 | Harvey | |
| 7,564,309 B2 | 7/2009 | Chiu | |
| 7,656,229 B2 * | 2/2010 | Deng et al. | 330/149 |
| 7,917,120 B1 * | 3/2011 | Gilbert | 455/333 |
| 2006/0049873 A1 * | 3/2006 | Britton et al. | 330/253 |

* cited by examiner

*Primary Examiner* — Patricia Nguyen
(74) *Attorney, Agent, or Firm* — Knobbe Martens Olson & Bear LLP

(57) ABSTRACT

An input bias current cancellation circuit includes reference transistors placed in series and a current summation network. The current summation network can be configured to sum the base currents of the reference transistors to produce a summed current. A current mirror can be provided to attenuate the summed current to produce input bias cancellation currents. The input bias cancellation currents can be provided to the base inputs of an input bipolar differential pair, thereby reducing input current noise.

26 Claims, 6 Drawing Sheets

APPARATUS AND METHOD FOR REDUCING CURRENT NOISE

BACKGROUND

1. Field

Embodiments of the invention relate to electronic devices, and more particularly, to input bias current cancellation circuits.

2. Description of the Related Technology

An operational amplifier or an instrumentation amplifier can have one or more bipolar input transistors having an input bias current. The input bias current and associated current noise can be often higher than would be desired. The input current noise can be introduced at the input of the input transistors and amplified subsequently, thereby adversely affecting the operation of the amplifier.

In certain instances, an amplifier can have an input bias current cancellation circuit to cancel its input bias current. The input bias current cancellation circuit can generate a reference current in a manner similar to that causing the input bias current. The reference current can be mirrored to form an input bias cancellation current, which can be received by the input transistors, thereby canceling the input bias current.

However, input current noise is not cancelled by the input bias current cancellation circuit because the input bias cancellation current noise is not correlated to the input bias current noise. Rather, the input bias current cancellation circuit can actually have the undesirable side effect of increasing the input current noise.

Description of FIGS. 1, 2A and 2B

FIG. 1 is a schematic block diagram illustrating a conventional amplification circuit 100 that includes a bipolar input differential pair 9 and an input bias current cancellation circuit 6. The differential pair 9 forms an input stage, and can include a first input transistor 1 and a second input transistor 2. The illustrated transistors 1, 2 are NPN bipolar transistors, each of which has an emitter, a base, and a collector. In other instances, each of the transistors 1, 2 can be PNP bipolar transistors. In certain instances, the amplification circuit can further include additional transistors to form the input stage.

The differential pair 9 can be biased for desired amplifier performance with a tail current source 3. The current of the tail current source 3 can be selected so as to, for example, place the input transistors 1, 2 in the forward-active region. For purposes of illustration only, the tail current source 3 can be referred to as having a current value of "$I_T$" hereinafter. Skilled artisans will recognize that the current value $I_T$ can be selected from a multitude of values, depending on a variety of circuit design constraints and factors.

As illustrated in FIG. 1, a positive terminal 4 and a negative terminal 5 can be electrically connected to the bases of the input transistors 1, 2, respectively. Even when no input signal is applied to the positive and negative terminals 4, 5, base currents can flow in the first and second input transistors 1, 2 as a result of the biasing provided by the tail current source 3.

In order to prevent an input bias current from being drawn from the positive and negative terminals 4, 5, the input bias current cancellation circuit 6 can supply the bias currents of the first and second input transistors 1, 2. In particular, the input bias current cancellation circuit 6 can be configured to produce a first cancellation current $I_1$ and a second cancellation current $I_2$ having a magnitude substantially equal to that of the base bias currents of the first and second input transistors 1, 2. When the input transistors 1, 2 are substantially identical and have a common-emitter current gain of beta ("$\beta$"), the input transistors 1, 2 have base bias currents of about $I_T/2\beta$. Accordingly, the first and second cancellation currents $I_1$, $I_2$ can be configured to have a value of about $I_T/2\beta$, so as to substantially provide the base bias currents of the input transistors 1, 2.

FIG. 2A illustrates a bipolar differential pair 9 provided with a conventional input bias current cancellation circuit 6. The input bias current cancellation circuit 6 is electrically connected to the bipolar differential pair 9 having first and second input transistors 1, 2, which receive positive and negative inputs 4, 5, respectively. The input transistors 1, 2 are biased by a tail current source 3, as described earlier in connection with FIG. 1. The input bias current cancellation circuit 6 can provide first and second cancellation currents $I_1$, $I_2$ to substantially cancel the input bias currents of the input transistors 1, 2. The illustrated input bias current cancellation circuit 6 includes a reference current source 10, a reference transistor 11, a diode 12, a first mirror transistor 13, and a second mirror transistor 14. The illustrated input bias current cancellation circuit 6 is connected to a first voltage reference V1 and a second voltage reference V2.

The reference transistor 11 can be biased with the reference current source 10 having a current value of about $I_T/2$, which is substantially equal to the bias current received by each of the input transistors 1, 2. Additionally, the reference transistor 11 can be chosen to be substantially identical to the first and second input transistors 1, 2 so that all three of the transistors have substantially identical transistor geometries and properties. Accordingly, the base current $I_{refB}$ of the reference transistor 11 and the base bias currents of the first and second input transistors 1, 2 can also be substantially equal, and can have a value of about $I_T/2\beta$. Thus, the base current $I_{refB}$ of the reference transistor 11 can be mirrored to produce the first and second cancellation currents $I_1$, $I_2$.

The base current $I_{refB}$ of the reference transistor 11 can be mirrored in a variety of ways. In the illustrated example, mirroring can be accomplished using the diode 12, the first mirror transistor 13, and the second mirror transistor 14, which are collectively referred to as a current mirror 16. As shown in FIG. 2A, the first and second mirror transistors 13, 14 can be PNP bipolar transistors, each having a PN junction between the emitter and base nodes. As skilled artisans will recognize, the bias current through the diode 12 creates a voltage across the diode 12, which can be placed across the emitter and base nodes of the first and second mirror transistors 13, 14. By biasing the base-emitter voltages of the first and second mirror transistors 13, 14 in this manner, the input bias current cancellation circuit 6 can provide the first and second cancellation currents $I_1$, $I_2$, each having a value of about $I_T/2\beta$.

While canceling the input bias currents, the input bias current cancellation circuit 6 can increase input current noise significantly. For example, the shot noise of a bipolar transistor having a base current of $I_B$ has a mean square value $i_n^2$ of about $2qI_B\Delta f$, where q is the magnitude of the electrical charge on an electron and $\Delta f$ is the frequency band of interest in the amplifier. Thus, the base current of the transistor 1 (or the transistor 2) can have mean square shot noise when biased at $I_T/2\beta$ equal to about $qI_T\Delta f/\beta$. Neglecting the noise in the current mirror 16, which can typically be quite small, the noise in the first and second cancellation currents $I_1$, $I_2$ has a mean square value equal to about the shot noise in the base current $I_{refB}$, or $qI_T\Delta f/\beta$. The noise in the first and second cancellation currents $I_1$, $I_2$ is added to the noise of the base currents of the input transistors 1, 2 to produce the overall input current noise. The noise from the input bias current cancellation circuit 6 and the noise in the base currents of the input transistors 1, 2 are typically uncorrelated, and thus the conventional input bias current cancellation circuit 6 increases the overall root mean square ("rms") input current noise by a factor of √2.

FIG. 2B illustrates a bipolar differential pair 9 having an input bias current cancellation circuit 19. As will be described below, the reduced input current noise relative to the circuit illustrated in FIG. 2A comes at the expense of increased power consumption. The illustrated input bias current cancellation circuit 19 includes a reference current source 20, a reference transistor 21, a diode 22, a first mirror transistor 23, and a second mirror transistor 24. As shown in FIG. 2B, the reference current source 20 has a current value of $N*I_T/2$, where N is selected to be greater than 1 to reduce input bias current noise, as will be described below.

As shown in FIG. 2B, the current of the reference current source 20 can be increased relative to the current of the reference current source 10 of FIG. 2A by a factor of N. Additionally, the geometries of the illustrated reference transistor 21 and diode 22 can likewise be increased by a factor of N relative to the geometries of the reference transistor 11 and diode 12 of FIG. 2A.

The first mirror transistor 23 and the second mirror transistor 24 can have geometries similar to those of the first and second mirror transistors 13, 14 of FIG. 2A. However, the size of the diode 22 relative to the first and second mirror transistors 23, 24 is selected to be about N times greater so as to form a current mirror having an attenuation factor of N. Thus, the cancellation currents $I_1$, $I_2$ can substantially match with the input bias currents to the transistors 1, 2.

By increasing the current of the reference current source 20 relative to that shown in FIG. 2A, the overall noise in the first and second cancellation currents $I_1$, $I_2$ can be reduced, thereby reducing the overall input current noise. Although increasing the current of the reference current source 20 increases the noise of the base current $I_{refB}$, the noise of the base current $I_{refB}$ increases only in proportion to the square root of the reference source current, since the shot noise of a bipolar transistor having a base current of $I_B$ has a theoretical mean square value $i_n^2$ of $2qI_B\Delta f$. However, the current mirror attenuates the noise proportionally. The noise of the current $I_{refB}$ is increased by a factor of √N, but the current mirror 16 attenuates the current noise by a factor of N. Accordingly, increasing the current of the reference current source 20 reduces the rms input current noise caused by the input bias current cancellation circuit 6 by a factor of √N. However, the reduction in noise comes at the cost of increased power consumption.

Increasing the current of the reference current source 20 can increase overall power consumption considerably. In low-noise amplifiers, $I_T$ can be, for example, in the milliamp range, and therefore it may not be feasible to increase the current of the reference current source 20.

SUMMARY

In one embodiment, an apparatus for biasing an comprises a first transistor, a second transistor, and a current summation network. The first transistor includes an emitter, a base and a collector. The second transistor an emitter and a base, wherein the emitter of the second transistor is electrically connected to the collector of the first transistor. The current summation network is configured to receive a current of the base of the first transistor and a current of the base of a second transistor and to generate a summed current comprising the sum of at least the currents of the bases of the first and second transistors.

In another embodiment, a method is provided for biasing an amplifier. The method comprises providing a first transistor having an emitter, a collector, and a base and a second transistor having an emitter and a base, wherein the collector of the first transistor and the emitter of the second transistor are electrically connected. The method further comprises biasing the emitter of the first transistor with a current source, generating a summed current by summing at least a current of the base of the first transistor and a current of the base of the second transistor, and mirroring the summed current to produce a mirrored current for biasing the amplifier.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught or suggested herein without necessarily achieving other objects or advantages as may be taught or suggested herein.

All of these embodiments are intended to be within the scope of the invention herein disclosed. These and other embodiments will become readily apparent to those skilled in the art from the following detailed description of the preferred embodiments having reference to the attached figures, the invention not being limited to any particular preferred embodiment(s) disclosed.

DETAILED DESCRIPTION OF EMBODIMENTS

Figure 1:
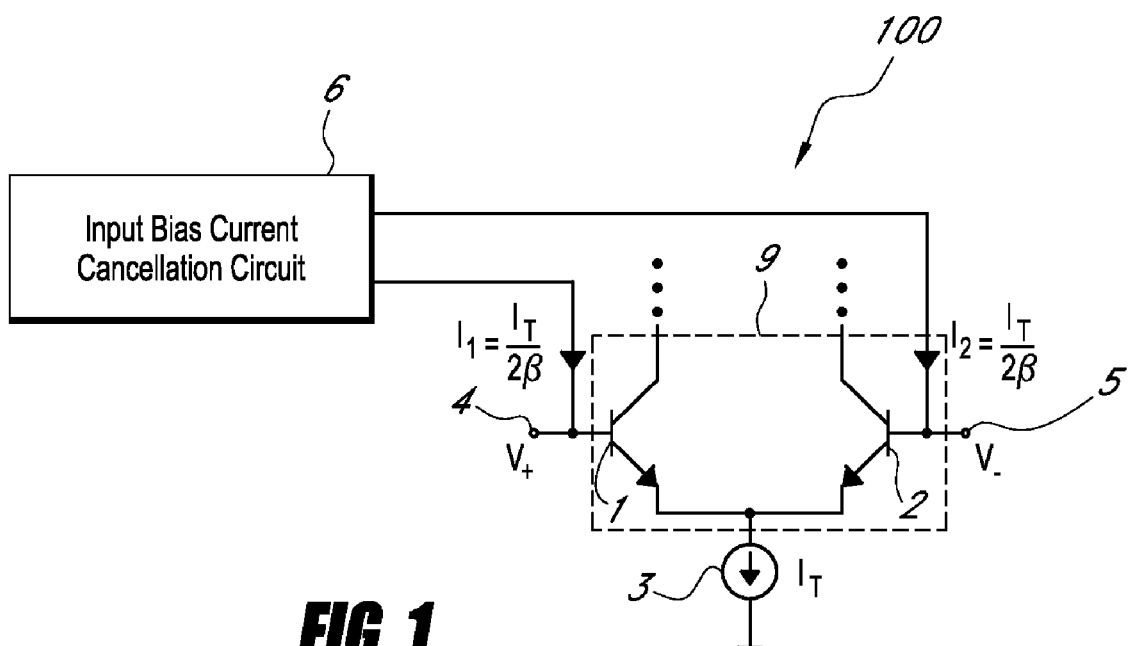
FIG. 1 is a schematic block diagram illustrating a conventional amplification circuit including a bipolar differential pair and an input bias current cancellation circuit.

The following detailed description of certain embodiments presents various descriptions of specific embodiments of the invention. However, the invention can be embodied in a multitude of different ways as defined and covered by the claims. In this description, reference is made to the drawings where like reference numerals indicate identical or functionally similar elements.

Improved Input Bias Current Cancellation Circuits at a Given Power Consumption

In some embodiments, an input bias current cancellation circuit includes reference transistors placed in series, a current summation network, and a current mirror. The current summation network can be configured to sum the base currents of the reference transistors to produce a summed current. The current mirror can be provided to attenuate the summed current to produce input bias cancellation currents. Although the summed current can have increased current noise in proportion to the square root of the number of reference transistors, the current mirror can be configured to reduce the current noise proportionally. Thus, increasing the number of reference transistors can reduce the rms current noise of the input bias cancellation currents without increasing power consumption. The input bias cancellation currents can be provided to the base inputs of an input bipolar differential pair, thereby reducing input current noise.

Figure 2A:
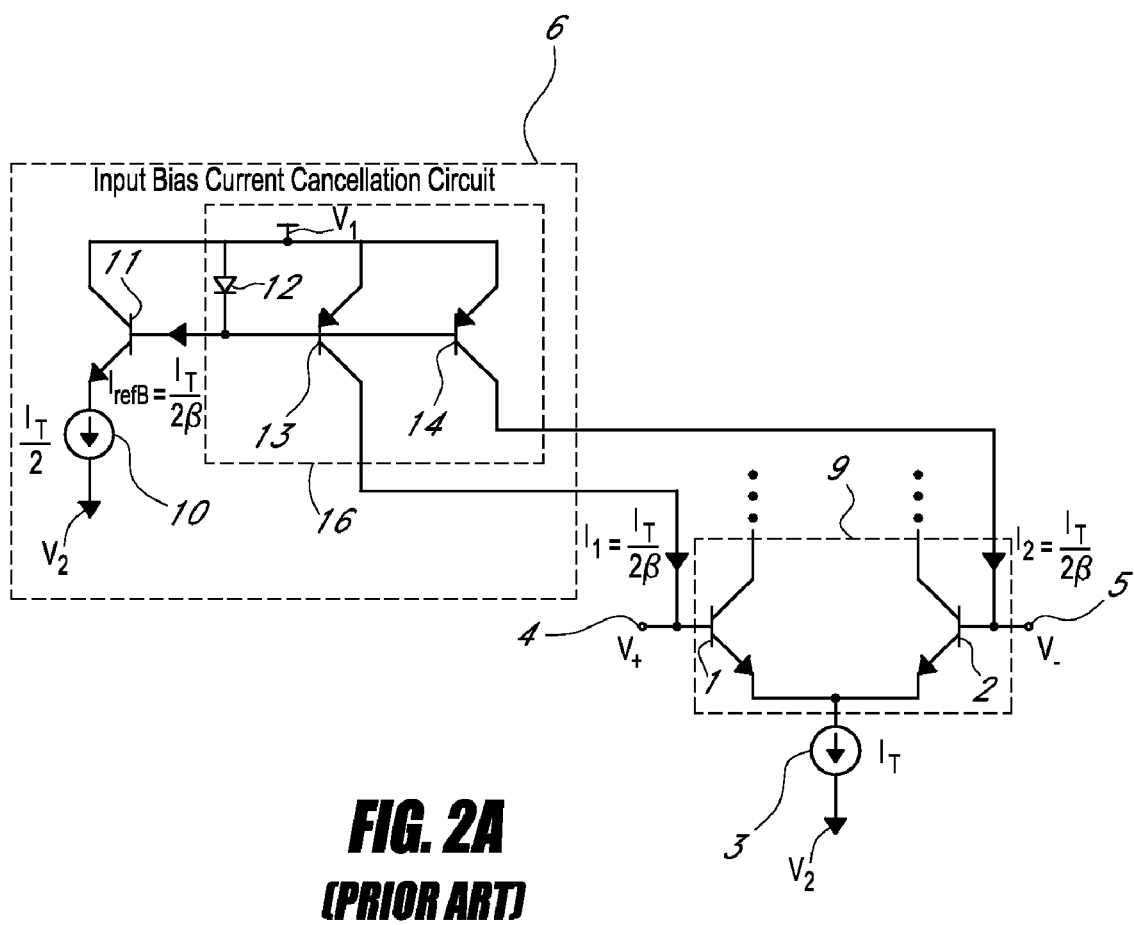
FIG. 2A is a circuit diagram of a conventional amplification circuit including a bipolar differential pair and an input bias current cancellation circuit.
Figure 3:
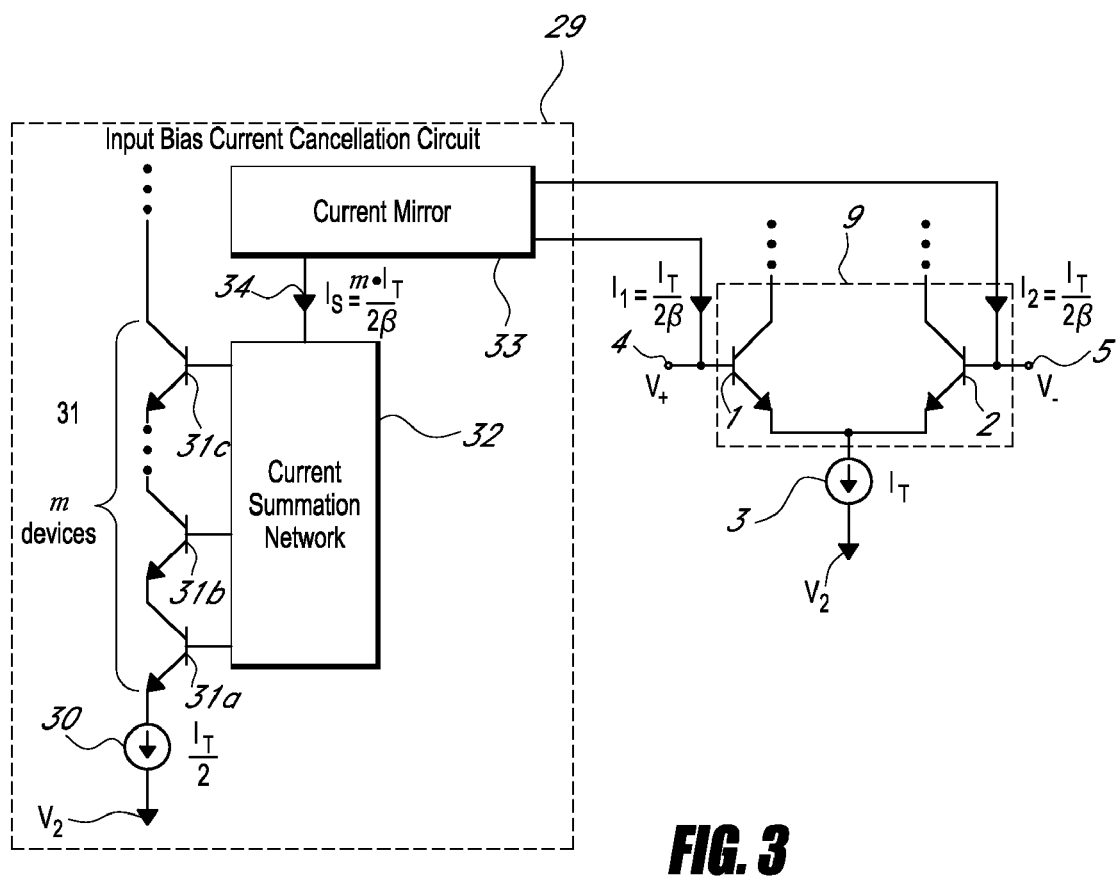
FIG. 3 is a circuit diagram of a bipolar differential pair having an input bias current cancellation circuit with reduced current noise in accordance with one embodiment.

FIG. 3 illustrates a bipolar differential pair 9 provided with an input bias current cancellation circuit 29 in accordance with one embodiment. The illustrated input bias current cancellation circuit 29 includes a reference current source 30, a plurality of reference transistors 31, a current summation network 32, and a current mirror 33. As will be described below, the illustrated input bias current cancellation circuit 29 has reduced input current noise compared to the noise of the input bias current cancellation circuit 6 illustrated in FIG. 2A at about the same power consumption.

The reference current source 30 can be used to bias the reference transistors 31, which can include m devices placed in series. Each of the reference transistors 31 is biased at an emitter current substantially equal to the current of the reference current source 30. In one embodiment, each of the reference transistors 31 is substantially identical in size and polarity to the first and second input transistors 1, 2.

The current summation network 32 serves to add the base currents of the reference transistors 31 to produce a summed current $I_S$. The current summation network 32 can be implemented in a variety of ways, as will be discussed in further detail below. Approximating the emitter currents of each of the reference transistors 31 to be about $I_T/2$, the summed current $I_S$ can have a value of about $m^*I_T/2\beta$, where m is equal to the number of reference transistors 31.

Figure 2B:
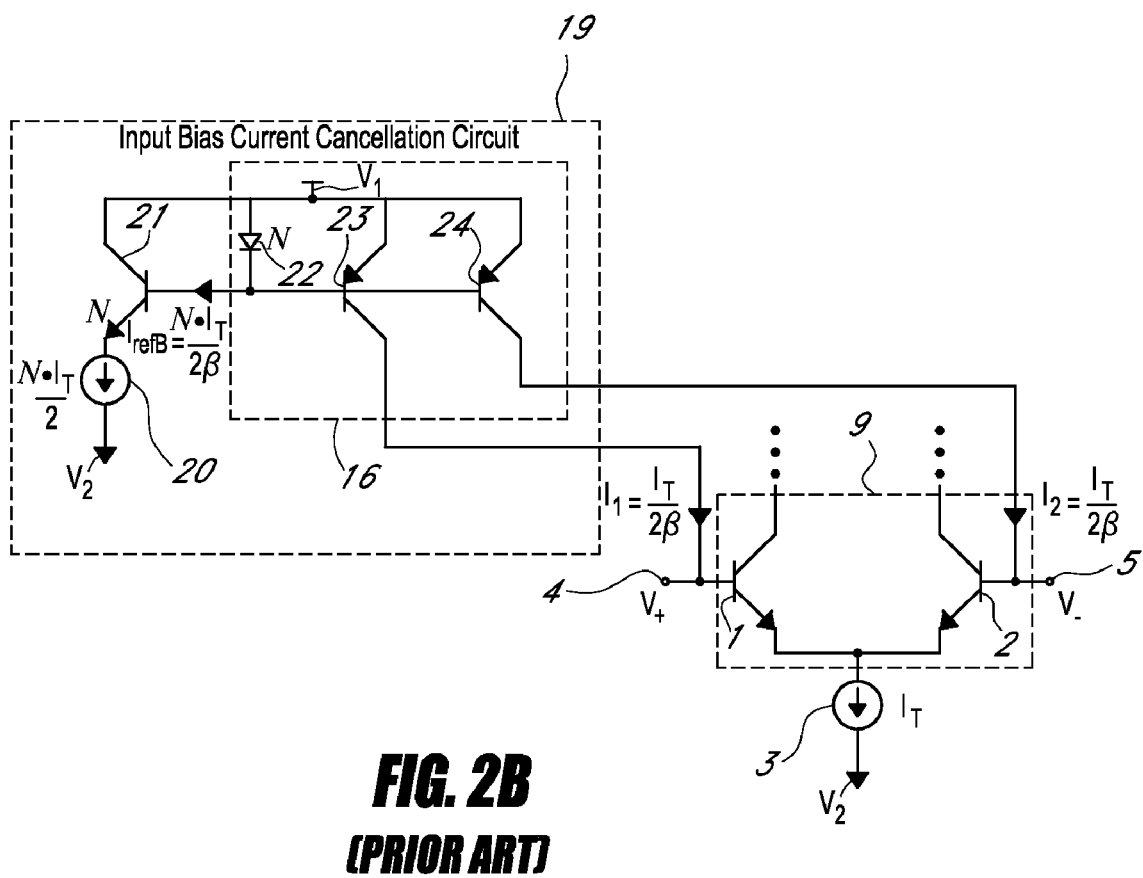
FIG. 2B is a circuit diagram of another conventional amplification circuit including a bipolar differential pair and an input bias current cancellation circuit.

The current mirror 33 serves to receive the summed current $I_S$ and produce first and second input cancellation currents $I_1$, $I_2$ in response to the summed current $I_S$. The current mirror 33 can have an attenuation factor of m so that the cancellation currents $I_1$, $I_2$ substantially match with the input bias currents to the transistors 1, 2. The current mirror 33 can be implemented using, for example, the configuration illustrated in FIG. 2B, a cascode current mirror, a Wilson current mirror, or the like.

Approximating the emitter currents of each of the reference transistors 31 to be about $I_T/2$, the mean square value $i_{bn}^2$ of the shot noise of each base current of the reference transistors 31 is equal to about $qI_T\Delta f/\beta$. In other words, each of the reference transistors 31 has its own base current noise. If the noises of the base currents of the reference transistors 31 were perfectly correlated with one another, the summed current $I_S$ produced by the current summation network 32 would have m times the rms current noise of one of the base currents of the reference transistors 31. However, typically the shot noise of the base currents of the reference transistors 31 is uncorrelated with respect to each other, and hence the summed current $I_S$ has rms current noise equal to $\sqrt{m}$ times the noise of one of the m reference transistors 31. Thus, providing m number of reference transistors 31 increases the rms current noise by a factor of $\sqrt{m}$. However, the current mirror is selected to attenuate the rms current noise proportionally by a factor of m. Accordingly, increasing the number of reference transistors 31 reduces the rms input current noise from the input bias current cancellation circuit by a factor of $\sqrt{m}$. In contrast to the noise reduction achieved in the circuit illustrated in FIG. 2B, the reduction in input current noise can be achieved without increasing supply current, that is, without increasing power consumption.

As described in detail above, FIG. 3 demonstrates reducing input current noise by placing the reference transistors 31 in series and taking advantage of the uncorrelated nature of the noise in the base currents of the reference transistors 31. In one embodiment, the number of reference transistors 31 is chosen so that there is sufficient headroom to keep each of the reference transistors 31 biased in the forward-active region.

The illustrated reference transistors 31 are shown as being NPN type transistors. However, persons of ordinary skill in the art will recognize that the principles described herein are applicable to a PNP configuration. In particular, when the first and second input transistors 1, 2 are PNP bipolar transistors, the reference transistors 31 can be selected to be PNP bipolar transistors. Additionally, the first and second input transistors 1, 2 and the reference transistors 31 can be implemented using a variety of transistor types, including other types of minority carrier devices. For example, the transistors can include heterojunction bipolar transistors or superbeta bipolar transistors.

Although the reference current source 30 is shown in FIG. 3 as having half the current of the tail current source 3, this is for illustrative purposes only. The amount of current of the reference current source 30 can be increased to reduce input current noise or decreased to reduce power, thereby achieving the desired balance between input current noise and power consumption, as described above with reference to FIGS. 2A and 2B. For example, the current of the reference current source 30, the gain of the current mirror 33, and the geometries of the reference transistors 31 can be increased by about 25% to further reduce input current noise at a cost of about a 25% increase in power. Skilled artisans will recognize that the reference current source 30 is illustrated as having a value of about $I_T/2$ so as to compare the input current noise of the input bias current cancellation circuits 29 (FIG. 3) and 6 (FIG. 1) when the circuits are consuming substantially the same supply current.

Figure 4:
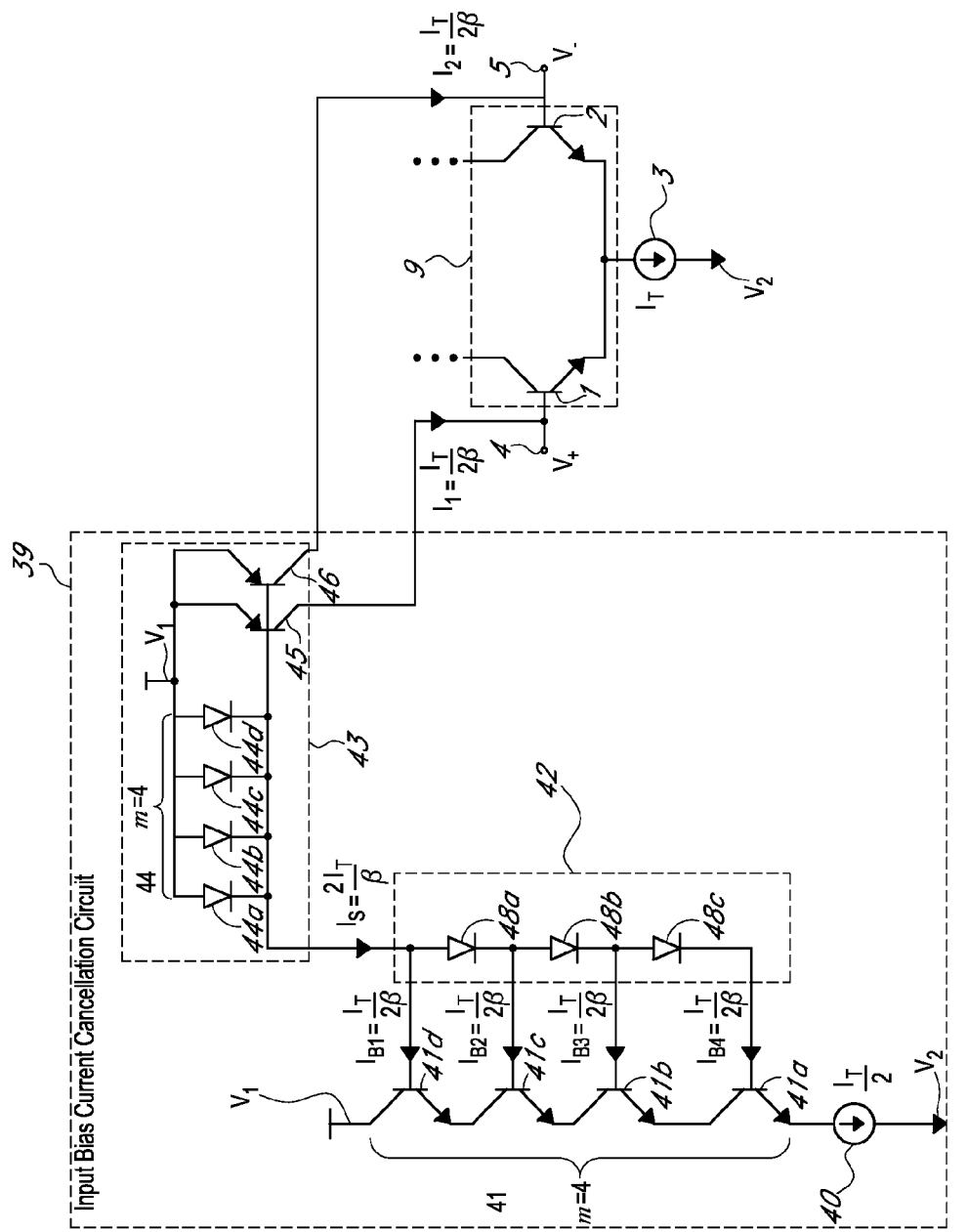
FIG. 4 is a circuit diagram of a bipolar differential pair having an input bias current cancellation circuit with reduced current noise in accordance with another embodiment.

FIG. 4 illustrates a bipolar differential pair 9 having an input bias current cancellation circuit 39 with reduced current noise in accordance with another embodiment. The illustrated input bias current cancellation circuit 39 includes a reference current source 40, reference transistors 41, a current summation network 42, and a current mirror 43. As shown in FIG. 4, the illustrated input bias current cancellation circuit 39 is connected to a first voltage reference V1 and a second voltage reference V2. Skilled artisans will recognize that additional elements may be present between the voltage references V1 and V2 and one or more of the illustrated circuit components.

The reference current source 40 can be used to bias the reference transistors 41, which can include m devices placed in series. In one embodiment, each of the reference transistors 41 is substantially identical in size and polarity to the first and second input transistors 1, 2. For purposes of illustration only, the input bias current cancellation circuit 39 is illustrated for the case where m equals four and in which the current of the reference source equals $I_T/2$. A skilled artisan will, however, appreciate that the number of the transistors 41 and the current of the reference source can vary widely depending on the design of the circuit.

The base currents of the reference transistors 41 can be added using the current summation network 42 to produce a summed current $I_S$. The current summation network 42 can include one or more diodes 48a-48c. The diodes 48a-48c can be formed from, for example, bipolar transistors, MOS transistors, or a variety of other devices having one or more PN junctions. In the illustrated embodiment in which four reference transistors 41a-41d are used, first, second and third diodes 48a, 48b, and 48c can be used.

As illustrated in FIG. 4, the diodes 48a-48c can be placed end-to-end in series and can be configured to keep the reference transistors 41 biased in the forward-active region. The anode of the first diode 48a can be connected to the base of the fourth transistor 41d, while the cathode of the first diode 48a can be connected to the base of the third transistor 41c and the anode of the second diode 48b. The cathode of the second diode 48b can be connected to the base of the second transistor 41b, as well as to the anode of the third diode 48c. The cathode of the third diode 48c can be connected to the base of the first transistor 41a. Although the current summation network 42 is illustrated and described for the case where m equals four (4), persons of ordinary skill in the art will recognize that a different number of diodes can be used when m is selected to be another value.

Approximating the emitter currents of each of the reference transistors 41 to be about $I_T/2$, the summed current $I_S$ can have a value of about $m*I_T/2\beta$. In the illustrated embodiment where m equals four, the summed current $I_S$ can have a value of about $2I_T/\beta$. The summed current $I_S$ can be provided to the current mirror 43 to produce first and second input cancellation currents $I_1$, $I_2$.

The illustrated current mirror 43 includes first to fourth mirror diodes 44a-44d, a first mirror transistor 45 and a second mirror transistor 46. The operation of the current mirror 43 is substantially similar to the operation of the current mirror described earlier with reference to FIG. 2B. In the illustrated embodiment where m equals 4, the current mirror 43 has an attenuation factor of about 4. Although the current mirror 43 is illustrated as being implemented using diodes and PNP transistors, a vast variety of current mirrors well known in the art and current mirrors not presently known can be used with one or more embodiments described herein. For example, the current mirror 43 can include the current mirror configuration illustrated in FIG. 2B, a cascode current mirror, a Wilson current mirror, or the like.

Approximating the emitter currents of each of the reference transistors 41 to be about $I_T/2$, the mean square value $i_{bn}^2$ of the shot noise of each base current of the reference transistors 41 is equal to about $qI_T\Delta f/\beta$. Because the shot noise of each base current of the reference transistors 41 is uncorrelated, the summed current $I_S$ has rms current noise equal to $\sqrt{m}$ times the noise of one of the base currents of the reference transistors 41. However, the current mirror attenuates the current noise proportionally by a factor of m. Thus, in the illustrated embodiment where m equals four, the rms input current noise of the input bias current cancellation circuit 39 is reduced by about a factor of 2. In contrast to the noise reduction achieved in the circuit illustrated in FIG. 2B, the reduction in input current noise does not need to come at an increase in power consumption.

Figure 5:
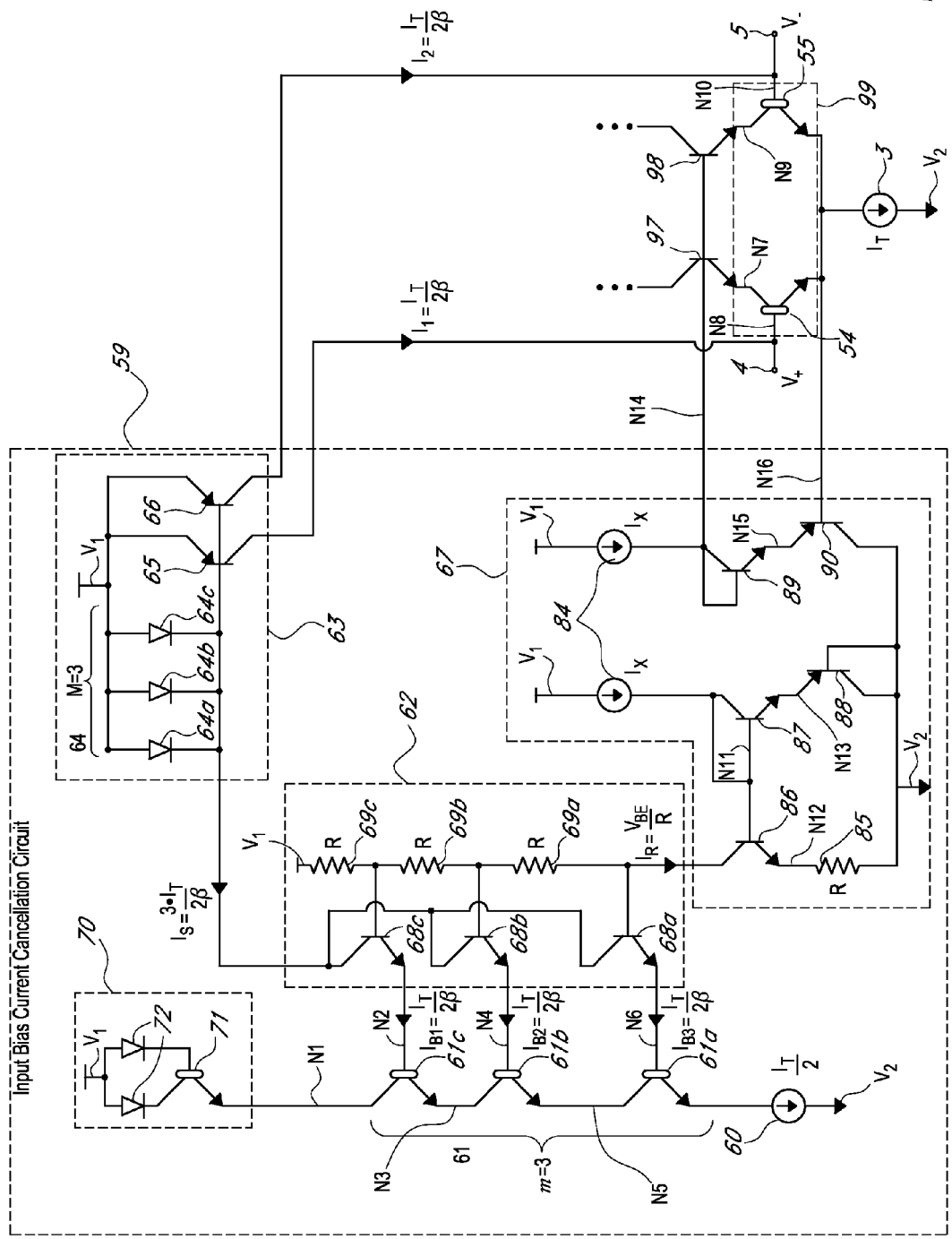
FIG. 5 is a circuit diagram of a superbeta bipolar differential pair having an input bias current cancellation circuit with reduced current noise in accordance with yet another embodiment.

FIG. 5 illustrates a superbeta bipolar differential pair 99 having an input bias current cancellation circuit 59 with reduced current noise in accordance with yet another embodiment. As illustrated, the superbeta bipolar differential pair 99 includes a first superbeta input transistor 54 and a second superbeta input transistor 55, each of which has a base electrically connected to the input bias current cancellation circuit 59. The input bias current cancellation circuit 59 can provide the first and second superbeta input transistors 54, 55 with first and second cancellation currents $I_1$, $I_2$, respectively.

Superbeta bipolar transistors can have very high β factors (e.g., greater than about 1000), which can reduce the base current of the input transistors and therefore the magnitude of the first and second cancellation currents $I_1$, $I_2$. Reducing the magnitude of the first and second cancellation currents $I_1$, $I_2$ can be desirable because the input current noise introduced by the input bias current cancellation circuit is a function of the magnitude of the first and second cancellation currents $I_1$, $I_2$. Thus, including superbeta transistors in the bipolar differential input pair can reduce input current noise. In the embodiment illustrated in FIG. 5, both superbeta transistors and the noise reduction technique described earlier with reference to FIGS. 3 and 4 are used to reduce input current noise.

A superbeta transistor can have, for example, a very lightly doped base and/or an emitter positioned very closely to the base, which can result in a superbeta transistor having a low Early voltage and a low breakdown voltage. A low Early voltage can result in the transistor current gain being a strong function of collector-base voltage, and a low breakdown voltage can necessitate that the superbeta transistor collector-base voltage be kept small. Accordingly, to achieve good current cancellation when using superbeta input transistors, the superbeta transistors in the input bias current cancellation circuit should have substantially the same collector-base voltage as the first and second superbeta input transistors 54, 55, and the collector-base voltage of the superbeta transistors can be chosen to be small. The illustrated input bias current cancellation circuit 59 accomplishes both of these goals, thereby permitting the use of first and second superbeta input transistors 54, 55 in the superbeta bipolar differential pair 99, which can result in input current noise reduction. Additionally, the input bias current cancellation circuit 59 utilizes a current summation network 62 to further reduce the input current noise of the input bias current cancellation circuit 59, as will be described below.

The illustrated input bias current cancellation circuit 59 includes a reference current source 60, superbeta reference transistors 61, a current summation network 62, a current mirror 63, a first bias circuit 66, and a second bias circuit 70. As shown in FIG. 5, the input bias current cancellation circuit 59 is connected to a first voltage reference V1 and a second voltage reference V2. Skilled artisans will recognize that additional elements may be present between the voltage references V1 and V2 and one or more of the illustrated circuit components.

The reference current source 60 can be used to bias the superbeta reference transistors 61, which can include m superbeta devices placed in series. In one embodiment, each of the superbeta reference transistors 61 is substantially identical in size and polarity to the first and second superbeta input transistors 54, 55. For purposes of illustration only, the input bias current cancellation circuit 59 is illustrated for the case in which m equals three and where the current of the reference source equals about $I_T/2$.

The base currents of the superbeta reference transistors 61 can be added using the current summation network 62 to produce a summed current $I_S$. The current summation network 62 can include, for example, one or more transistors and resistors. In the illustrated embodiment where three superbeta reference transistors 61 are used, the current summation network 62 can include first, second and third network transistors 68a, 68b, and 68c and first, second and third resistors 69a, 69b, and 69c.

As shown in FIG. 6, the first resistor 69a has a first end electrically connected to the base of the first network transistor 68a, and a second end electrically connected to the base of the second network transistor 68b and to a first end of the second resistor 69b. The second resistor 69b has a first end connected to the second end of the first resistor 69a and to the base of the second network transistor 68b, and a second end electrically connected to the base of the third network transistor 68c and to the first end of the third resistor 69c. The third resistor 69c has a first end electrically connected to the second end of the second resistor 69b and to the base of the third network transistor 68c, and a second end electrically connected to the first reference voltage V1. As illustrated in FIG. 6, the collectors of network transistors 68a-68c can be electrically connected together, and the emitters of the first, second and third network transistors 68a, 68b, and 68c can be connected to the bases of the first, second and third superbeta reference transistors 61a, 61b, and 61c, respectively.

The network transistors 68a, 68b, and 68c can include, for example, bipolar NPN or PNP transistors. In one embodiment, the network transistors 68a-68c are configured to keep the superbeta reference transistors 61 biased in the forward-active region while keeping the base-collector voltage of the superbeta reference transistors 61 small and substantially equal to that of the first and second superbeta input transistors 54, 55. As skilled artisans will recognize, using approximation via neglecting the relatively small base currents of the network transistors 68a-68c, the current summation network 62 can operate to sum the base currents of superbeta reference transistors 61 to produce the summed current $I_S$. Although the current summation network 62 is illustrated for the case in which m equals three, persons of ordinary skill in the art will recognize that a different number of transistors and resistors can be used when m is selected to be another value.

Approximating the emitter currents of each of the superbeta reference transistors 61 to be about $I_T/2$ and neglecting the base currents of the transistors 68a-68c for analysis, the summed current $I_S$ can have a value of about $m*I_T/2\beta$. In the illustrated embodiment where m equals three, the summed current $I_S$ has a value of about $3I_T/2\beta$. The summed current $I_S$ can be provided to the current mirror 63 to produce the first and second cancellation currents $I_1$, $I_2$.

The illustrated current mirror 63 includes diodes 64a-64c, first mirror transistor 65 and second mirror transistor 66. The operation of the current mirror 63 is substantially similar to the operation of the current mirror described above with reference to FIG. 2B. In the illustrated embodiment where m equals 3, the current mirror 63 is configured to have an attenuation factor of about 3. Although the current mirror 63 is illustrated as being implemented using diodes and PNP transistors, persons of ordinary skill in the art will recognize that a vast variety of current mirrors are well known in the art and could be used in accordance with one or more embodiments described herein. For example, the current mirror 63 could include the current mirror configuration illustrated in FIG. 2B, a cascode current mirror, or a Wilson current mirror. In addition diodes can be implemented with transistors.

Approximating the emitter currents of each of the superbeta reference transistors 61 to be about $I_T/2$, the mean square value $i_{bn}^2$ of the shot noise of each base current of the superbeta reference transistors 61 is equal to about $qI_T\Delta f/\beta$. Because the shot noise of each base current of the superbeta reference transistors 61 is uncorrelated, the summed current $I_S$ has rms current noise equal to $\sqrt{m}$ times the noise of one of the base currents of the m reference transistors 61. However, the current mirror 63 attenuates the current noise proportionally by a factor of m. Thus, in the illustrated embodiment where m equals three (3), the rms input current noise of the input bias current cancellation circuit 59 is reduced by about a factor of $\sqrt{3}$. In contrast to the noise reduction achieved in the circuit illustrated in FIG. 2B, the reduction in input current noise does not come at the cost of a significant increase in supply current.

The illustrated input bias current cancellation circuit 59 can also be configured to control the base-collector voltages of the superbeta reference transistors 61 and the first and second superbeta input transistors 54, 55. The current summation network 62 and the first and second bias circuits 66, 70 can cooperate to bias the base-collector voltages of the superbeta reference transistors 61 and the first and second superbeta input transistors 54, 55 at a substantially similar voltage near zero volts. In particular, the base-collector voltages of the superbeta transistors can be biased at a substantially similar voltage near zero volts by configuring the input bias current cancellation circuit 59 to substantially match the voltage at nodes N1 and N2, N3 and N4, N5 and N6, N7 and N8, and N9 and N10, respectively.

In one embodiment, matching the collector-base voltages of the superbeta transistors is accomplished by configuring the current summation network 62 and the first and second bias circuits 66 and 70 to produce an equal number of base-emitter voltage drops for nodes N1 and N2, N3 and N4, N5 and N6, N7 and N8, and N9 and N10, respectively. For example, as will be described in further detail below, the current summation network 62 can include the resistors 69a-69c, which can be configured to receive a current $I_R$ such that each resistor has a voltage drop substantially equal to the base-emitter voltage drop of a bipolar transistor biased in the forward-active region, or $V_{BE}$. Additionally, the network transistors 68a-68c can be biased in the forward-active region, so that the voltage drop between the base and emitter of each network transistor 68a-68c is substantially equal to $V_{BE}$. Accordingly, node N2 can be biased at two $V_{BE}$ drops below the first voltage reference V1, node N4 can be biased at three $V_{BE}$ drops below the first voltage reference V1, and node N6 can be biased at four $V_{BE}$ drops below the first voltage reference V1.

Furthermore, the superbeta reference transistors 61 can be biased in the forward-active region, such that the base-emitter voltage of each superbeta transistor is substantially equal to $V_{BE}$. Thus, node N3 can be biased at three $V_{BE}$ drops below the first voltage reference V1 and node N5 can be biased at four $V_{BE}$ drops below the first voltage reference V1. Moreover, the second bias circuit 70 can be configured such that node N1 is biased at two $V_{BE}$ drops below the first voltage reference V1. For example, as illustrated in FIG. 5, the second bias circuit 70 can include a superbeta transistor 71 and first and second diodes 72. The emitter of the superbeta transistor 71 can be connected to node N1, the anode of the first diode can be connected to the first reference voltage V1 and the cathode to the collector of the superbeta transistor 71, and the anode of the second diode can be connected to the first reference voltage V1 and the cathode to the base of the superbeta transistor 71. The superbeta transistor 71 can be biased in the forward-active region with a base-emitter voltage substantially equal to $V_{BE}$ and the two diodes 72 can be biased to have a voltage drop substantially equal to $V_{BE}$, thus biasing the node N1 at about two $V_{BE}$ drops below the first voltage reference V1.

As persons of ordinary skill in the art will recognize, the embodiment described above biases nodes N1 and N2 at two $V_{BE}$ drops below the first voltage reference V1, nodes N3 and N4 at three $V_{BE}$ drops below the first voltage reference V1, and nodes N5 and N6 at four $V_{BE}$ drops below the first voltage reference V1. Thus, the base-collector voltages of the superbeta reference transistors 61 can be biased at a substantially similar voltage near zero volts. Although the embodiment has been described for the case where m equals three, skilled artisans will recognize that the method can be applicable to other values of m.

In order to produce a voltage drop across the resistors 69a-69c substantially equal to $V_{BE}$, the resistors 69a-69c can be configured to receive the current $I_R$ substantially equal to $V_{BE}$ divided by the resistance R of the resistors. Although there are many ways to produce such a current, one possible implementation is as shown in FIG. 5.

The illustrated first bias circuit 66 includes current sources 84, a resistor 85, a first transistor 86, a second transistor 87, a third transistor 88, a fourth transistor 89, and a fifth transistor 90. As shown in FIG. 5, one of the current sources 84 is connected to the base of the first transistor 86 and to the base and emitter of the second transistor 87 at the node N11. The third transistor 88 has an emitter electrically connected to the emitter of the second transistor 87 at the node N13 and a base and collector electrically connected to the second reference voltage V2. The resistor 85 has a first end electrically connected to the emitter of the first transistor 86 at a node N12, and a second end electrically connected to the second reference voltage V2. The collector of the first transistor 86 can provide the illustrated current $I_R$.

As shown in FIG. 5, the second of the current sources 84 is electrically connected to the base and emitter of the fourth transistor 89 at the node N14. The fifth transistor 90 has an emitter electrically connected to the emitter of the fourth transistor 89 at a node N15. As will be described in further detail below, the base voltages of the fourth and fifth transistors 89 and 90 can be used externally to the first bias circuit 66 to configure the collector-base voltages of the superbeta bipolar differential pair 99.

In one embodiment, the resistance of the resistor 85 is chosen to be substantially equal to the resistance R of each of the resistors 69a-69c. Additionally, although the precise current value is not critical, the current sources 84 can be selected to have a current that is large enough to place first, second, third, fourth and fifth transistors 86-90 in the forward-active region. Accordingly, the voltage drop across each base-emitter junction of the transistors 87-90 can be substantially equal to $V_{BE}$. Thus, the node N13 can be biased at one $V_{BE}$ drop above the second voltage reference V2 and the node N11 can be biased at two $V_{BE}$ drops above the second voltage reference 91. Moreover, first transistor 86 can be configured to be substantially identical to second transistor 87 and to be biased in the forward-active region, such that node N12 is biased at a $V_{BE}$ drop below node N11, or equivalently at one $V_{BE}$ drop above the second voltage reference V2. Accordingly, a voltage substantially equal to $V_{BE}$ can be placed across the resistor 85 so that the current $I_R$ is substantially equal to $V_{BE}$ divided by R.

Additionally, the current sources 84 can be matched so that fourth and fifth transistors 89 and 90 are biased in the forward-active region and have a base-emitter voltage substantially equal to $V_{BE}$. Thus, node N15 can be biased at a $V_{BE}$ drop below node N14 and node N16 can be biased at two $V_{BE}$ drops below node N14. Additionally, first and second superbeta input transistors 54, 55 and sixth and seventh transistors 97 and 98 can be biased in the forward-active region and have a base-emitter voltage substantially equal to $V_{BE}$. Accordingly, nodes N7 and N9 can be biased at a $V_{BE}$ drop below node N14 and nodes N8 and N10 can be biased at a $V_{BE}$ drop above node N16, or equivalently at a $V_{BE}$ drop below node N14.

As persons of ordinary skill in the art will recognize, the embodiment described above has biased nodes N7, N8, N9 and N10 at one $V_{BE}$ drop below the node N14. Thus, the base-collector voltages of the first and second superbeta input transistors 54, 55 can be biased at a substantially similar voltage near zero volts, and this voltage is substantially equal to the voltage of the base-collector voltage of the superbeta reference transistors 61, as described in detail above. Since the superbeta reference transistors 61 and the first and second superbeta input transistors 54, 55 have substantially the same collector-base voltage, relatively good current cancellation is achieved, even when using superbeta transistors. Thus, FIG. 5 illustrates a circuit having input current noise reduction from both superbeta input transistors and the input bias current cancellation circuit 59.

For purposes of illustration only, the embodiments described with reference to FIG. 5 above have been demonstrated in the context of NPN superbeta transistors. Skilled artisans will recognize that the embodiments are equally applicable to a PNP configuration. In particular, when the first and second superbeta input transistors 54, 55 are PNP superbeta transistors, the superbeta reference transistors 61 can be selected to be PNP superbeta transistors.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Applications

Devices employing the above described schemes can be implemented into various electronic devices. Examples of the electronic devices can include, but are not limited to, consumer electronic products, parts of the consumer electronic products, electronic test equipment, etc. Examples of the electronic devices can also include memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi functional peripheral device, a wrist watch, a clock, etc. Further, the electronic device can include unfinished products.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:
1. An apparatus for biasing an amplifier comprising:
a first transistor having an emitter, a base and a collector;

a second transistor having an emitter and a base, wherein the emitter is electrically connected to the collector of the first transistor; and a current summation network configured to receive a current of the base of the first transistor and a current of the base of a second transistor and to generate a summed current comprising the sum of at least the currents of the bases of the first and second transistors.

2. The apparatus of claim 1, further comprising a third transistor having an emitter and a base, wherein the second transistor further includes a collector electrically connected to the emitter of the third transistor and the current summation network is further configured to receive a current of the base of the third transistor and generate the summed current comprising the sum of at least the current of the base of the first, second, and third transistors.

3. The apparatus of claim 1, wherein the first transistor and the second transistor are NPN bipolar transistors.

4. The apparatus of claim 1, wherein the first transistor and the second transistor are PNP bipolar transistors.

5. The apparatus of claim 1, further comprising a current mirror configured to receive the summed current and generate a mirrored current for biasing the amplifier.

6. The apparatus of claim 5, further comprising an input transistor of the amplifier having a base, wherein a current of the base of the input transistor comprises the mirrored current.

7. The apparatus of claim 6, wherein the emitter of the first transistor is electrically connected to a first current source having a current magnitude substantially equal to a first current magnitude and the input transistor further includes an emitter electrically connected to a second current source having a current magnitude substantially equal to a second current magnitude, and wherein the magnitude of the summed current divided by the magnitude of the mirrored current is equal to about a factor of m times the first current magnitude divided by the second current magnitude, wherein m is a positive integer.

8. The apparatus of claim 7, wherein m is equal to the number of base currents received by the current summation network.

9. The apparatus of claim 7, wherein the first transistor, the second transistor, and the input transistor have substantially matched transistor geometries.

10. The apparatus of claim 1, wherein the current summation network comprises a first diode electrically connected between the base of the first transistor and the base of the second transistor.

11. The apparatus of claim 10, wherein the first transistor and the second transistor are NPN bipolar transistors, and the first diode includes an anode electrically connected to the base of the second transistor and a cathode electrically connected to the base of the first transistor.

12. The apparatus of claim 10, wherein the first transistor and the second transistor are PNP bipolar transistors, and the first diode includes an anode electrically connected to the base of the first transistor and a cathode electrically connected to the base of the second transistor.

13. The apparatus of claim 2, wherein the current summation network comprises a first diode electrically connected between the base of the first transistor and the base of the second transistor and a second diode electrically connected between the base of the second transistor and the base of the third transistor.

14. The apparatus of claim 6, wherein the current summation network comprises:

a first resistor having a first terminal and a second terminal;

a third transistor having an emitter, a base, and a collector, wherein the emitter of the third transistor is connected to the base of the first transistor and the base of the third transistor is connected to the first terminal of the resistor; and a fourth transistor having an emitter, a base, and a collector, wherein the collector of the fourth transistor is connected to the collector of the third transistor, the emitter of the fourth transistor is connected to the base of the second transistor, and the base of the fourth transistor is connected to the second terminal of the resistor.

15. The apparatus of claim 14, wherein the first transistor, the second transistor, and the input transistor are superbeta bipolar transistors.

16. The apparatus of claim 14, further comprising a third current source connected to the first terminal of the first resistor, wherein the third current source includes a fifth transistor having a base and an emitter biased at a first voltage potential, wherein the third current source is adapted to produce a current having a magnitude substantially equal to the first voltage potential divided by the resistance of the first resistor.

17. The apparatus of claim 16, wherein the apparatus further comprises at least one transistor configured to control the voltage between the base and emitter of the input transistor.

18. A method of biasing an amplifier, the method comprising:

providing a first transistor having an emitter, a collector, and a base and a second transistor having an emitter and a base, wherein the collector of the first transistor and the emitter of the second transistor are electrically connected;

biasing the emitter of the first transistor with a current source;

generating a summed current by summing at least a current of the base of the first transistor and a current of the base of the second transistor; and mirroring the summed current to produce a mirrored current for biasing the amplifier.

19. The method of claim 18, further comprising providing a third transistor having an emitter and a base, wherein the second transistor further includes a collector electrically connected to the emitter of the third transistor, and wherein generating the summed current comprises summing at least the current of the base of the first transistor, the current of the base of the second transistor, and a current of the base of the third transistor.

20. The method of claim 19, wherein the first transistor and the second transistor are NPN bipolar transistors.

21. The method of claim 20, wherein generating the summed current comprises providing a first diode having an anode and a cathode, wherein the anode is electrically connected to the base of the first transistor and the cathode is electrically connected to the base of the second transistor.

22. The apparatus of claim 19, wherein the first transistor and the second transistor are PNP bipolar transistors.

23. The method of claim 22, wherein generating the summed current comprises providing a first diode having an anode and a cathode, wherein the anode is electrically connected to the base of the second transistor and the cathode is electrically connected to the base of the first transistor.

24. The method of claim 19, wherein generating the summed current comprises:

providing a first resistor having a first terminal and a second terminal;

providing a third transistor having an emitter, a base, and a collector, wherein the emitter of the third transistor is connected to the base of the first transistor and the base of the third transistor is connected to the first terminal of the resistor; and providing a fourth transistor having an emitter, a base, and a collector, wherein the collector of the fourth transistor is connected to the collector of the third transistor, the emitter of the fourth transistor is connected to the base of the second transistor, and the base of the fourth transistor is connected to the second terminal of the resistor.

25. The method of claim 24, further comprising providing an input transistor of the amplifier having a base and providing the mirrored current to the base of the input transistor.

26. The method of claim 24, wherein the first transistor, the second transistor, and the input transistor are superbeta bipolar transistors.

* * * * *